US005716533A

United States Patent [19]

O'Neill et al.

[11] Patent Number: 5,716,533

[45] Date of Patent: Feb. 10, 1998

[54] METHOD OF FABRICATING INK JET PRINTHEADS

[75] Inventors: James F. O'Neill, Penfield, N.Y.; Eric Peeters, Mountain View, Calif.

[73] Assignee: Xerox Corporation, Stamford, Conn.

[21] Appl. No.: 805,834

[22] Filed: Mar. 3, 1997

[51] Int. Cl.$^6$ .............................. H01L 21/00; B44C 1/22

[52] U.S. Cl. .............................. 216/27; 216/2; 216/33; 216/41; 216/56

[58] Field of Search .............................. 216/27, 39, 41, 216/33, 2, 56; 156/633.1, 644.1, 647.1, 657.1, 662.1

[56] References Cited

U.S. PATENT DOCUMENTS

| | | | |
|---|---|---|---|
| 4,864,329 | 9/1989 | Kneezel et al. | 216/27 X |
| 5,124,717 | 6/1992 | Campanelli et al. | 346/1.1 |
| 5,141,596 | 8/1992 | Hawkins et al. | 156/628 |
| 5,204,690 | 4/1993 | Lorenze, Jr. et al. | 346/1.1 |

OTHER PUBLICATIONS

Technical publication entitled "An Electrochemical p–n Junction Etch Stop for the Formation of Silicon Microstructures" by T.N. Jackson, M.A. Tischler and K.D. Wise; IEEE Electron Device Letters, EDS–2, 1981, pp. 44–45.

*Primary Examiner*—William A. Powell
*Attorney, Agent, or Firm*—Robert A. Chittum

[57] ABSTRACT

A method of fabricating ink jet printheads from channel plates with a low stress integral ink inlet filters and heater plates. The channel plates are obtained from p-type (100) silicon wafers, one surface of which has a lightly doped n-type patterned layer in the form of a screen. In the preferred embodiment, a first etch resistant material is deposited on both surfaces of the wafer and patterned on the surface of wafer opposite the one containing the n-type layer. The patterned first etch resistant material provides a first etch mask with channel and reservoir vias. A second etch resistant material is deposited over the first etch resistant material and patterned on the same wafer surface as the first etch resistant material in order to provide a second etch mask having reservoir vias smaller than the reservoir vias in the first etch mask, but aligned therewithin. The wafer with the two patterned etch masks is placed into an anisotropic etch bath and etched with a bias potential between the p-n junction formed by the patterned n-type layer and the p-type wafer and an electrode also in the etch bath. The patterned, lightly doped, n-type layer functions as an etch stop when under a bias potential, and because the doping level of the n-type layer is low, the internal stress is also low. When the reservoir recesses have been etched through the wafer leaving the patterned n-type layer covering the open bottom, the second etch resistant material is removed and the wafer replaced into the anisotropic etch bath to etch the channel recesses and complete the reservoir recesses with a similar bias potential. The first etch resistant material is removed and the channel wafer is aligned and bonded to a heater wafer. The bonded wafer pair is separated into a plurality of printheads having an integral inlet filter devoid of internal stress.

5 Claims, 7 Drawing Sheets

METHOD OF FABRICATING INK JET PRINTHEADS

BACKGROUND OF THE INVENTION

This invention relates to a method of fabricating ink jet printheads and more particularly to a method of fabricating thermal ink jet printheads having an integral filter for the ink inlets.

One problem associated with the thermal ink technology is the sensitivity of ink droplet directionality to particulates in the liquid ink. Particulate within the ink can also lead to jet dropout and thus reduced print quality. Print quality is directly related to accurate placement of the ink droplets on a recording medium and droplet directionality determines the accuracy of the ink droplet placement. Printheads achieve higher print quality with particulate-free ink, and it has been found that the degree of particulate-free ink is related to how close the final ink filtration of the ink is to the printhead. One source of particulate contamination is the manufacturing environment. Use of a clean room for the manufacture of the printhead may be a partial solution, but complete particle-free fabricating environments are not economically practical. This invention reduces the problem of particle contamination by providing an ink filtration means during printing by the printhead as well as during the fabrication of the printhead.

Several fabricating processes for manufacturing a printhead with an integral inlet filter have been tried but they usually develop high internal stresses which cause and propagate cracks in the silicon substrates, so that the yield of printheads is significantly impacted. Examples of prior art processes for fabricating printheads with an integral filter having high internal stress or undesirable complexity and costs are delineated below.

U.S. Pat. No. 5,204,690 discloses an ink printhead and method of fabrication thereof, which has an integral filter over the ink inlet of the printhead. The filter is produced by orientation dependent etching (ODE) during printhead fabrication. A silicon channel wafer is etched from one side to produce the reservoir recesses and associated ink channels. The reservoir recesses are produced by a time controlled etch process, so that each reservoir has a predetermined depth in the channel wafer. The channel wafer is etched from the other side to produce a pattern of filter pores in alignment with the bottoms of the reservoir recesses. Thus, integral filters are provided, but the time-dependent ODE adds complexity and the necessity of separate photolithography steps to etch the filter pores adds extra cost.

U.S. Pat. No. 5,124,717 discloses an ink jet printhead having an integral membrane filter fabricated over the surface of the printhead containing the ink inlet to the printhead reservoir. The integral membrane filter is formed out of one or more etch resistant masks by patterning filter pore vias therethrough which are in alignment with the open, etched-through bottom of the printhead reservoirs. In one embodiment and for added strength, the side of the channel wafer which is not exposed to the etchant to produce the channels and reservoirs is heavily doped to form an etch stop which prevents the reservoir recess from etching through the channel wafer. This heavily doped region between the pattern of filter pore vias in the etch resistant mask (membrane filter) and the bottom of the reservoir recess is etched using the membrane filter as a mask to open the filter pores through the heavily doped region of the channel wafer. The etched pores in the doped region are in alignment with the vias in the membrane filter and therefore increase the filter thickness and its overall strength. The membrane filter by itself is not very robust and the use of a patterned etch stop layer to obtain the desired robustness adds internal stress which tends to cause cracks which propagate through the wafer and reduce printhead yield.

U.S. Pat. No. 5,141,596 discloses an ink jet printhead having an integral filter over the inlet to the printhead reservoir and method of fabrication therefor. The surface of the channel wafer opposite the one etched to provide the channels and reservoirs is doped in a screen pattern to produce an etch stop layer in a screen pattern. The through etch of the reservoir recess exposes the patterned etch stop at the bottom of each reservoir recess but only the undoped regions are etched through, thereby providing an integral filter at the ink inlet. However, the integral filter produced this way is highly stressed and tends to develop and propagate cracks which dramatically reduces the yield of printhead.

Technical publication entitled "An Electrochemical p-n Junction Etch Stop for the Formation of Silicon Microstructures" by T. N. Jackson, M. A. Tischler, and K. D. Wise; IEEE Electron Device Letters, EDL-2, 1981, pp. 44–45, discloses a technique which includes the use of biased p-n junction which allows the p-type silicon to be selectively etched while preserving the electrical properties of the protected material.

SUMMARY OF THE INVENTION

It is an object of the present invention to provide an ink jet printhead having an integral inlet filter which has negligible internal stress so that printhead yield is minimally reduced.

In one aspect of the invention, there is provided a method of fabricating ink jet printheads having channel plates with a low-stress-causing integral filter for each ink inlet, comprising the steps of: depositing a layer of a first etch resistant material over a p-type silicon wafer having a top and a bottom surface; patterning the layer of first etch resistant material on the bottom surface of the wafer to form screen shaped via therein; producing a n-type layer in the wafer bottom surface through the filter screen shaped via in the first etch resistant material, so that the areas not exposed through the filter-screen-shaped via remain p-type silicon, the patterned n-type layer having a predetermined thickness and forming a p-n junction with the p-type wafer; stripping the layer of first etch resistant material from the wafer; depositing at least a second layer of etch resistant material on the top and bottom surfaces of the wafer; patterning the second layer of etch resistant material on the top surface of the wafer to form the sets of channel vias and a reservoir via for each set of channel vias; and etching sets of channel recesses and reservoir recesses through the vias respectively using a bias potential across the p-n junction to prevent etching of the patterned n-type layer and the development of internal stress therein, whereby the reservoir recess is etched through the wafer with only the patterned n-type layer remaining unetched in the bottom of the reservoir recess to produce the integral inlet filter.

In one embodiment of the invention, the channel wafer as processed above is aligned and bonded to a heater wafer having an array of heating elements and addressing electrodes on a first surface thereof, so that each reservoir recess forms an ink reservoir with the open bottom covered by an integral filter which serves as an ink inlet and so that each channel recess forms an ink channel and contains a heating element. The integral filters prevent entry of contaminating particles into the ink reservoirs which are larger than integral filter pores during the remaining fabricating processes and during printing or storage. Next, the bonded channel and heater waters are separated into a plurality of individual printheads by a dicing operation which concurrently open one end of the channels to produce the ink droplet ejecting nozzles.

The present invention will now be described by way of example with reference to the accompanying drawings, wherein like reference numerals refer to like elements, and in which.

DESCRIPTION OF THE PREFERRED EMBODIMENT

Figure 1:
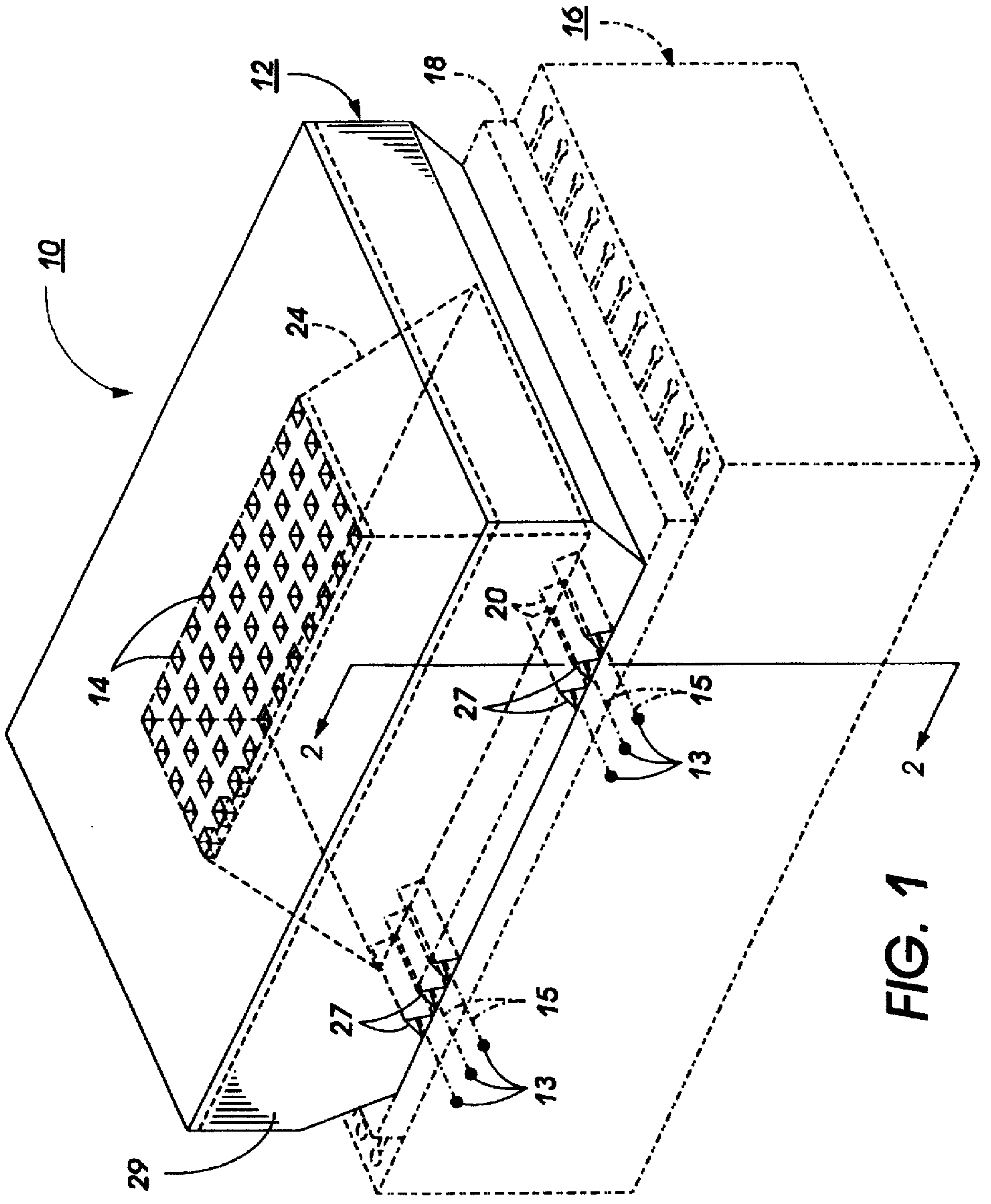
FIG. 1 is an enlarged schematic isometric view of a single printhead having the integral filter fabricated in accordance with the present invention.
Figure 2:
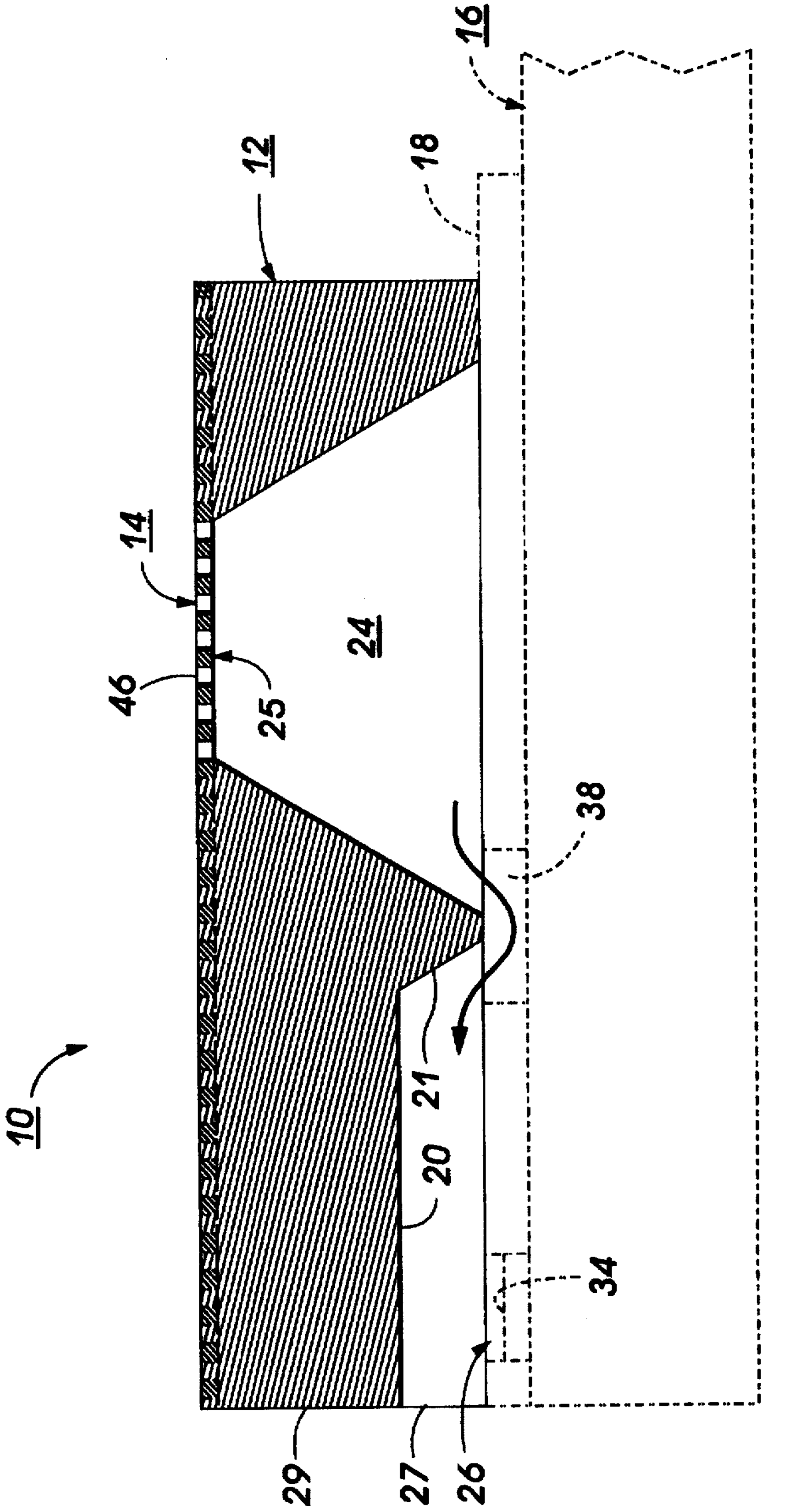
FIG. 2 is a cross-sectional view of the printhead as viewed along view line 2—2 of FIG. 1.

In FIGS. 1 and 2, a thermal ink jet printhead 10 is shown comprising channel plate 12 with integral filter 14 of the present invention and heater plate 16 shown in dashed line. A patterned thick film layer 18 is shown in dashed line having a material, such as, for example, polyimide, and is sandwiched between the channel plate and the heater plate. As disclosed in U.S. Pat. No. 4,774,530 and incorporated herein by reference, the thick film layer is etched to remove material above each heating element 34, thus placing them in pits 26, and to remove material between the closed ends 21 of the ink channels 20 and the reservoir 24 forming trench 38 in order to place the channels into fluid communication with the reservoir. For illustration, droplets 13 are shown in FIG. 1 that are following trajectories 15 after ejection from the nozzles 27 of the printhead.

In the embodiment shown in FIG. 1, the channel plate is permanently bonded to the thick film layer on the heater plate. Although the present invention is described for an edgeshooter type printhead configuration, it could readily be used for a roofshooter type printhead configuration (not shown) as disclosed in U.S. Pat. No. 4,864,329, wherein the ink inlet is in the heater plate, and the method of fabricating an integral ink inlet filter for a heater plate inlet could be used in an identical manner as described herein below for the ink inlet of a channel plate.

Channel plate 12 contains a reservoir recess 24 etched from one surface thereof, as shown in dashed line in FIG. 1. The reservoir recess forms the ink reservoir when mated to the heater plate 16. A plurality of identical parallel grooves or channels 20, also shown in dashed line in FIG. 1, are etched in the same surface of the channel plate as the reservoir recess and have triangular cross-sectional areas when etched using the orientation dependent etching (ODE) process; i.e., anisotropic etching. The ends of the channels, which penetrate the front face or edge 29 of the mated channel and heater plates, are open and serves as droplet emitting nozzles 27. As shown in FIG. 2, the other ends 21 of the channels are adjacent but spaced from the reservoir, so that they are closed. Once the channel and heater plates are mated, a dicing operation, such as that disclosed in U.S. Pat. No. 4,774,530, cuts through them and the ends of the channels opposite the closed ends 21 to produce the front face 29 and the nozzles 27. An integral filter 14 is located at the inlet 25 of the reservoir. Filter 14 is fabricated in accordance with the present invention as discussed below.

In addition to filtering out contamination from the ink and ink supply system during printing, the filter also keeps dirt and other debris from entering the relatively large inlets during subsequent printhead assembly procedures. In this way, it is possible to use less stringently clean and, therefore, less expensive assembly rooms for printhead manufacture, after the channel wafer and heater wafer have been bonded together.

Figure 3:
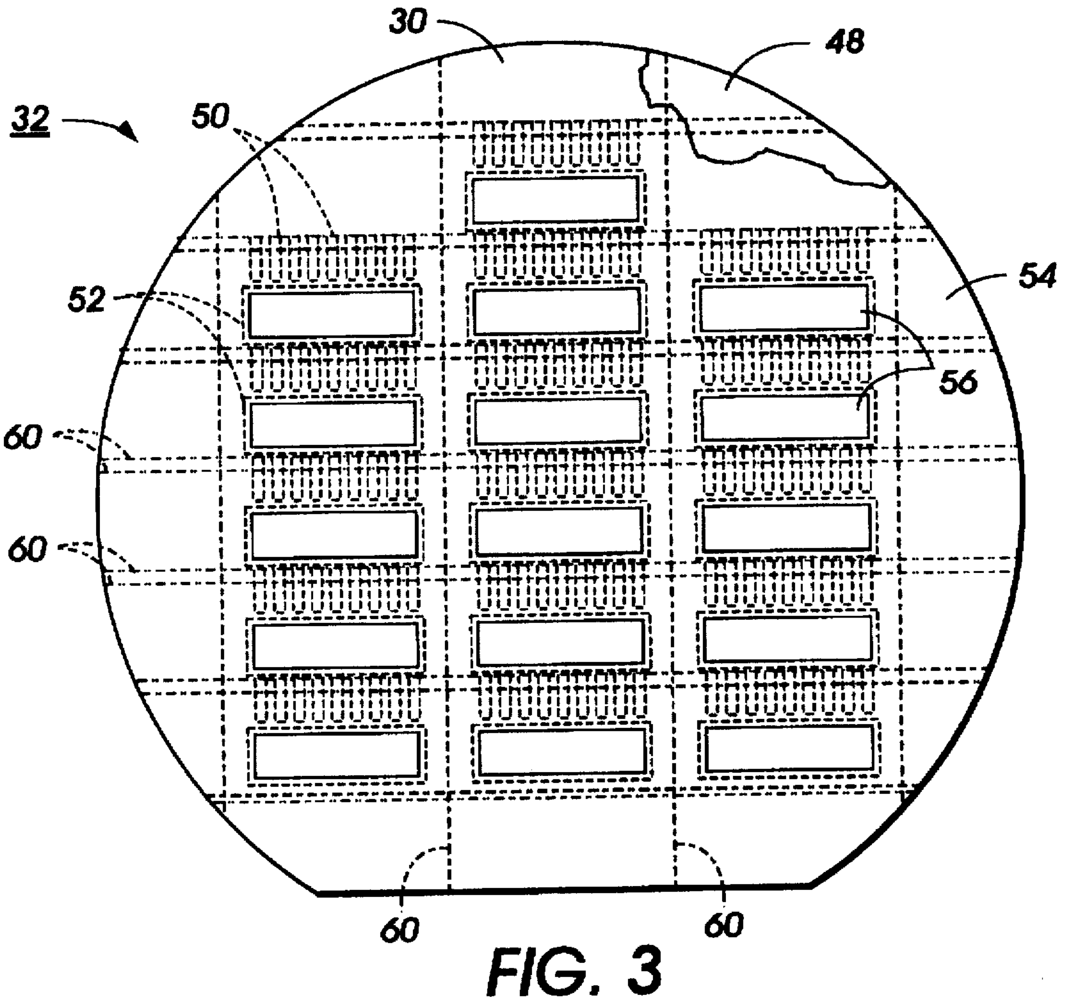
FIG. 3 is a plan view of the top surface of a channel wafer showing the reservoir vias in the etch resistant material and the subsequent dicing lines in dashed line.
Figure 4:
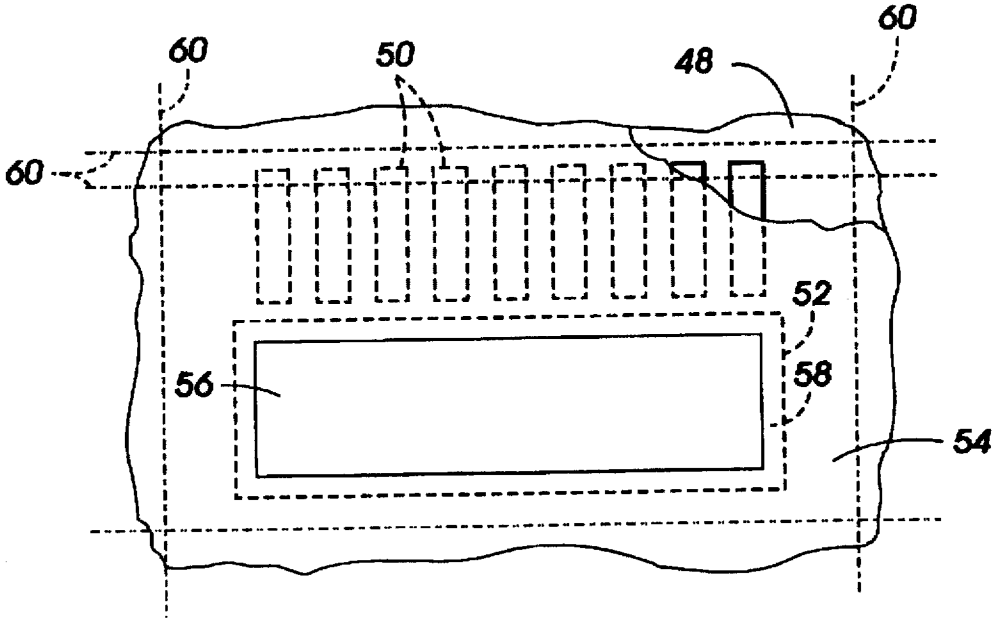
FIG. 4 is an enlarged plan view of a portion of the top surface of the channel wafer of FIG. 3 showing one channel plate with an underlying different etch resistant material patterned to provide vias, shown in dashed line, for a separate ODE of the channel recesses.
Figure 5:
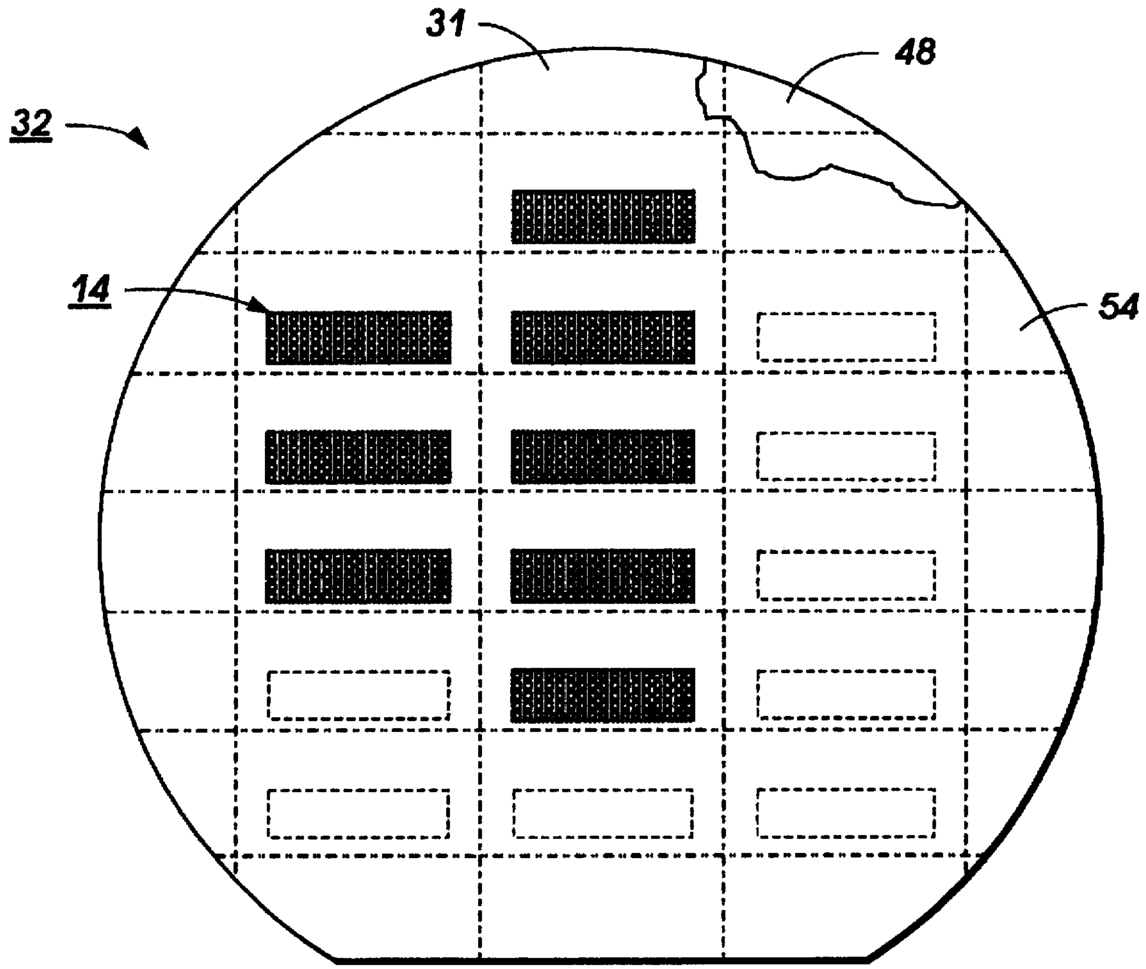
FIG. 5 is a plan view of the bottom surface of a channel wafer showing the filter pores of the integral filters of the inlets to the reservoir recesses.
Figure 10:
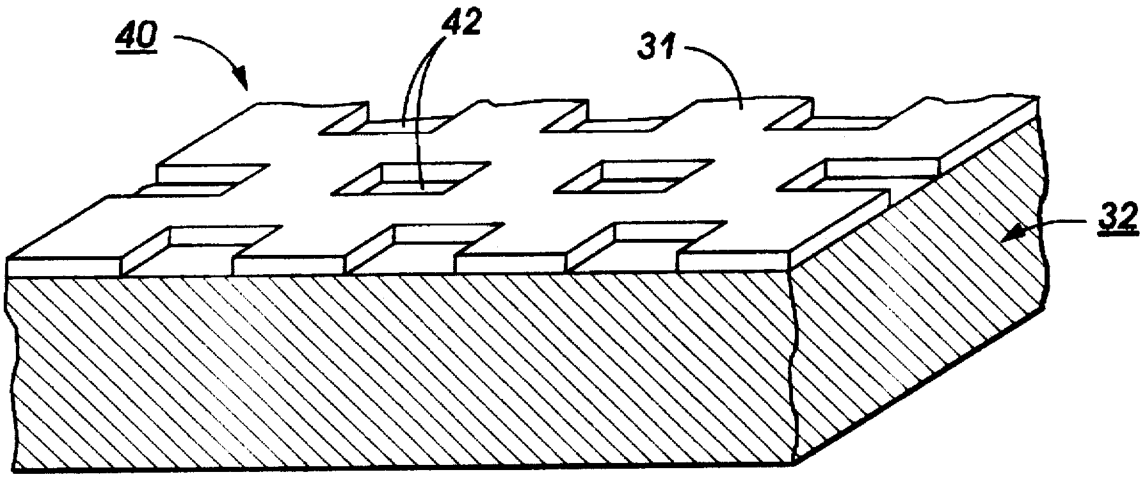
FIG. 10 is an enlarged, partially shown schematic isometric view of the channel wafer showing the filter-screen-shaped n-type layer on the bottom surface of the p-type wafer.

Referring to FIGS. 3 to 5, the fabricating process for the printhead having an integral inlet filter with low internal stress begins with a p-type (100) silicon wafer 32 having a thickness of about 20 mils (500 μm). In one embodiment, the wafer is cleaned and a lightly doped n-type layer (not shown) is produced on the bottom surface of the wafer having a depth of about 5–10 μm. The n-type layer is then photolithographically patterned to form a screen-shaped pattern 40 (shown in FIG. 10) with a uniformly spaced and centered openings 42 through the n-type layer. The openings 42 in the patterned n-type layer 40 expose the p-type wafer.

Figure 6:
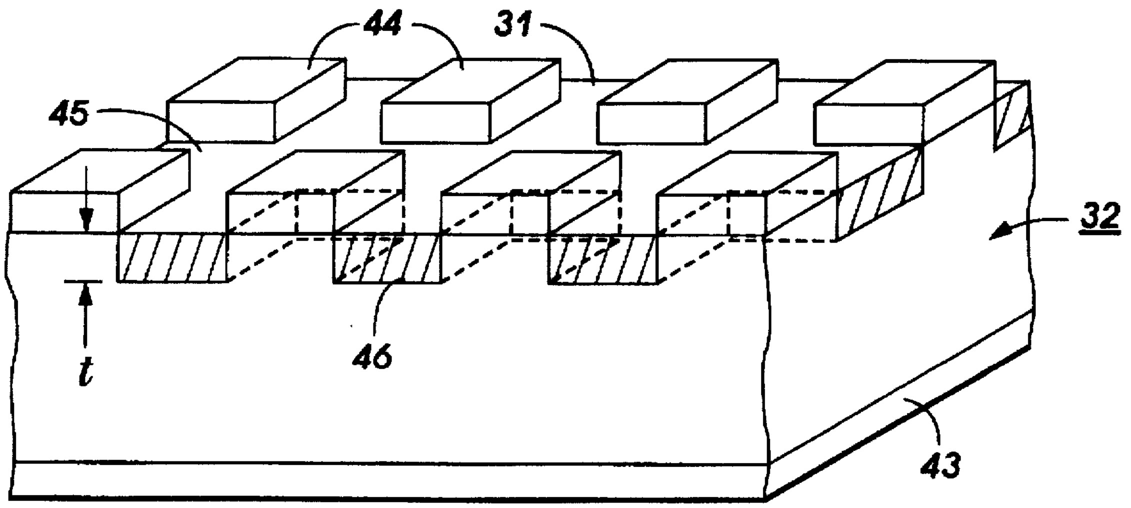
FIG. 6 is an enlarged, partially shown schematic isometric view of the channel wafer, showing the filter-screen-shaped via in the etch resistant material and the patterned n-type layer produced therewith.
Figure 7:
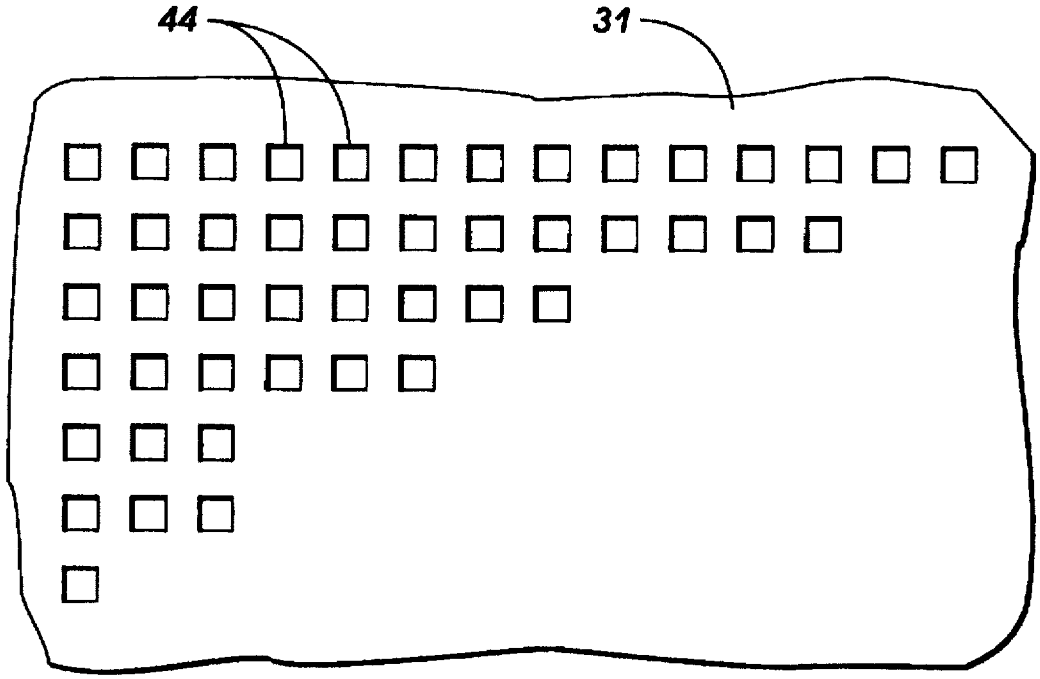
FIG. 7 is a partially shown plan view of the bottom surface of the channel wafer showing an array of equally spaced and dimensioned posts of etch resistant material used to form the filter-screen-shaped via used to produce the patterned n-type layer in the channel wafer.

In the preferred embodiment, a first silicon dioxide ($SiO_2$) layer is produced on the top surface 30 and bottom surface 31 of the p-type wafer 32 and a layer of photoresist (not shown) is deposited on the first $SiO_2$ layer on the wafer bottom surface 31 and patterned to produce an array of equally spaced and equally sized posts (not shown). The array of photoresist posts form a via (not shown) therearound having a grid or screen pattern which exposes the first $SiO_2$ layer. Although different shapes of posts could be used, 20×20 μm squares have been found to be appropriate. Using the photoresist posts as a mask, the exposed first $SiO_2$ layer is patterned to produce an array of $SiO_2$ posts 44 directly under the photoresist posts. The photoresist posts are removed, leaving only the $SiO_2$ posts on the p-type wafer bottom surface 31, as shown in FIGS. 6 and 7. FIG. 7 is a partial plan view of the bottom surface of wafer 32 in FIG. 5, showing the uniform pattern of $SiO_2$ posts over the entire wafer surface. Optionally, the array of posts are patterned only over the areas which will subsequently cover the reservoir open bottoms or inlets 25, as shown in FIG. 5. In another embodiment (not shown), photoresist may be used as the mask layer and patterned to form the filter-screen-patterned via instead of $SiO_2$, but is not the preferred mask.

Continuing with the preferred embodiment, the bottom surface 31 of the p-type wafer is lightly doped with a boron implant through the screen shaped via 45 formed by the array of $SiO_2$ posts 44 to form a screen shaped n-type layer 46 having a concentration of about $10^{12}$ boron ions/cc and to a desired depth 't' of 5–10 μm. The $SiO_2$ posts prevent the doping of the underlying p-type wafer. Alternatively, the bottom surface of the wafer may be doped through the $SiO_2$ mask of posts 44 by diffusion, using a gas phase or solid source boron and a silicon nitride mask, or by epitaxially growing a boron doped pattern. The purpose of the screen-shaped, lightly doped n-type layer is to function as a patterned etch stop. The interface of n-type layer and p-type silicon produces a p-n junction which is electrically biased during the etching process, discussed later, and prevents etching of the n-type layer. Because the n-type layer is only lightly doped, a stress build up during the ODE etching step for production of the reservoir recesses with the integral filters is prevented or substantially reduced. The bias potential enables the lightly doped n-type layer to function as an etch stop, and the internal stress is low because the required doping level is low. A high doping level for an n-type layer, such as boron $10^{19}$ to $10^{20}$ ions/cc, requires no voltage potential to stop the etch, but it is the high doping levels which lead to high levels of internal stress.

After the patterned n-type layer 46 is implanted, the $SiO_2$ posts on the bottom surface of the wafer and the $SiO_2$ layer 43 (FIG. 6) on the top surface of the wafer are removed. The wafer is recleaned, and a second $SiO_2$ layer 48 is thermally grown on the top and bottom surfaces of the wafer to a depth of 0.5 to 1 μm, depending upon the width of the channel to be subsequently etched. Since thermally growing a $SiO_2$ layer is a high temperature operation, it will diffuse the n-type layer and drive the p-n junction deeper, thus making the internal filter thicker and the pore size smaller. Accordingly, this dimensional change must be accounted for in the initial mask. Therefore, a $SiO_2$ deposition process using a lower temperature may be preferred. As shown in FIGS. 3 and 4, the $SiO_2$ layer 48 on the top surface 30 of the wafer is lithographically processed to form the channel vias 50 and the reservoir vias 52. Although only five channel vias are shown which represent the future ink channels, there are 300 to 1200 per inch (118 to 472 per cm) in an actual printhead. The small number of channel vias is shown for ease of explanation, it being understood that the same principle applies for an actual printhead. A silicon nitride ($Si_3N_4$) layer 54 is then deposited over the patterned $SiO_2$ layer and exposed silicon wafer top surface, in a manner taught by U.S. Pat. No. 4,863,560 and incorporated herein by reference.

The thickness of the $Si_3N_4$ layer is sufficient to assure adequate robustness to prevent handling damage during subsequent processing steps, generally about 0.1–0.2 μm. The $Si_3N_4$ layer is then lithographically processed to produce reservoir vias 56, which are smaller than and aligned within the reservoir vias 52 in $SiO_2$ layer 48. Thus, vias 56 expose the bare silicon wafer top surface 31 within the edges of the $Si_3N_4$ reservoir vias, which are spaced from the $SiO_2$ reservoir vias 52, so that a border 58 of $Si_3N_4$ layer 54 is left having a minimum width of about 15 μm inside the $SiO_2$ reservoir vias. Border 58 is for protection of the oxide layer during subsequent ODE processing using the $Si_3N_4$ layer as a mask. When the wafer is first anisotropically etched, as described later, the p-type silicon is etched through where exposed by the $Si_3N_4$ reservoir vias to form first reservoir recesses 23, as shown in FIG. 8 in dashed line.

FIG. 4 is an enlarged plan view of a portion of the top surface of wafer 32, showing one of the channel plates 12 prior to dicing along the dicing lines 60. The vias in the second $SiO_2$ layer, shown in dashed line, is more readily apparent in this enlarged view. The first anisotropically etched reservoir recesses 23 have walls which lie in the {111} crystal planes of the wafer. After the first etching process, the $Si_3N_4$ layer 54 is stripped and the wafer 32 cleaned again, followed by a second anisotropic etching process, using the second $SiO_2$ layer 48 as a mask to etch the channel recesses 20. Concurrently, with the second etching, the border of silicon exposed around the $SiO_2$ reservoir vias 52 are etched, enlarging the reservoir recesses 24 slightly to their final sizes, but maintaining its {111} crystal plane walls.

Figure 8:
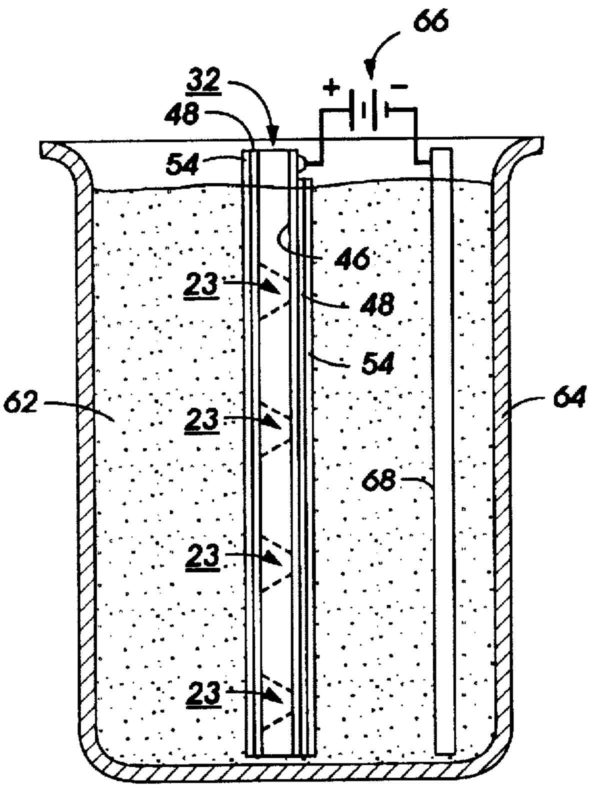
FIGS. 8 and 9 show a schematic cross-sectional elevational view of an etch bath for the channel wafer using a bias potential across the p-n junction of the wafer.
Figure 9:
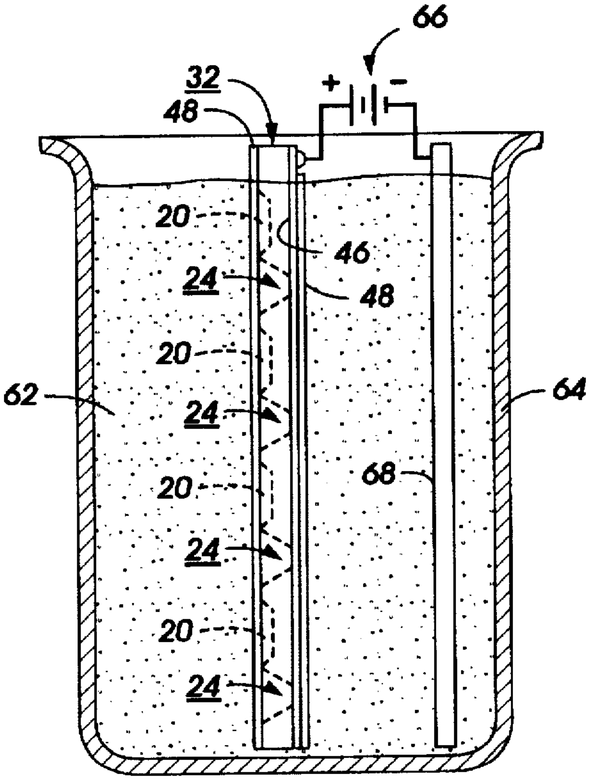

Referring to FIG. 8, the channel wafer 32 having the two patterned etch resistant layers, viz., the second $SiO_2$ layer 48 and $Si_3N_4$ layer 54, is placed in an anisotropic etchant bath 62, such as KOH, contained in an electrically insulative container 64. The patterned n-type layer 46 is electrically biased by connecting the n-type layer to the positive terminal of a DC voltage source 66 and the negative terminal to an electrode 68 also within the etchant in a manner similar to that disclosed in the IEEE Electron Device Letters article referenced above and incorporated herein by reference. The electrode 68 is typically of an inert material, such as, for example, platinum. Though the theoretical minimum potential is about 1 volt, the potential used is in the range of 3 to 5 volts to overcome voltage drops over contact resistances and the like. In FIG. 8, the firstly etched reservoir recesses 23 are shown in dashed line. After the first anisotropic etching shown in FIG. 8, the $Si_3N_4$ layer is stripped, as discussed above, the wafer with the remaining patterned second $SiO_2$ layer 48 is again placed in a second anisotropic etchant, as shown in FIG. 9. The second anisotropic etchant may be the same or similar KOH or may be EDP, and is also contained in an electrically insulative container 64. The wafer with the patterned second $SiO_2$ layer is etched while being electrically biased in the same way as described in FIG. 8, so that the channel recesses 20 are produced and the reservoir recesses 23 are slightly enlarged to their final size 24, shown in dashed line, as mentioned above.

When the second anisotropic etching is completed while being electrically biased, the second $SiO_2$ layer is stripped and the wafer recleaned by processes well known in the art. The etched channel wafer 32 is then aligned and bonded to a heater wafer (not shown) in a manner typically known in the industry. Next, the mated wafers are diced along the dicing lines 60 (FIGS. 3 to 5) to separate the wafers into a plurality of individual printheads 10, as shown in FIGS. 1 and 2.

Although the foregoing description illustrates the preferred embodiment, other variations are possible and all such variations as will be obvious to one skilled in the art are intended to be included within the scope of this invention as defined by the following claims.

We claim:

1. A method of fabricating ink jet printheads having channel plates with a low stress integral filter for each ink inlet, comprising the steps of:

(a) depositing a layer of a first etch resistant material over a p-type silicon wafer having a top and a bottom surface;

(b) patterning the layer of first etch resistant material on the bottom surface of the wafer to form screen shaped via therein;

(c) producing a n-type layer having a doping concentration in the wafer bottom surface through the filter-screen-shaped via in the first etch resistant material, so that the areas not exposed through the filter-screen-shaped via remain p-type silicon, the patterned n-type layer having a thickness and forming a p-n junction with the p-type wafer;

(d) stripping the layer of first etch resistant material from the wafer;

(e) depositing a second layer of etch resistant material on the top and bottom surfaces of the wafer;

(f) patterning the second layer of etch resistant material on the top surface of the wafer to form the sets of channel vias and a reservoir via for each set of channel vias; and;

(g) anisotropically etching sets of channel recesses and reservoir recesses through the respective vias in the second layer of etch resistant material using a bias potential across the p-n junction to prevent etching of the patterned n-type layer, whereby the reservoir recess is etched through the wafer with only the patterned n-type layer remaining unetched in the bottom of the reservoir recess to produce the integral inlet filter.

2. The method of claim 1, wherein the patterned n-type layer is produced by boron doping, the n-type layer having a relatively low boron doping concentration of about $10^{12}$ ions/cc;

wherein the bias potential is about 3 to 5 volts, with the n-type layer connected to the positive terminal of a voltage source; and wherein the n-type layer has a depth of about 5 to 10 μm.

3. The method of claim 2, wherein the method further comprises the steps of:

(h) after step (f) and before step (g), depositing a third layer of etch resistant material on the top and bottom surfaces of the wafer;

(i) patterning the third layer of etch resistant material on the top surface of the wafer to form sets of reservoir vias, the vias in the third layer of etch resistant material being smaller than the reservoir vias in the second layer of etch resistant material aligned therewith, so that a border of the third layer around via therein is within the reservoir via in the second layer of etch resistant material; and (j) anisotropically etching sets of reservoir recesses through the vias of the third etch resistant material using the bias potential across the p-n junction to prevent etching of the patterned n-type layer, whereby the reservoir recess is etched through the wafer with only the patterned n-type layer remaining unetched in the bottom of the reservoir recess to produce the integral inlet filter.

4. The method of claim 3, wherein the method further comprises the steps of:

(k) forming an array of heating elements and addressing electrodes on a first surface of a substrate for enabling selective application of electrical pulses to the heating elements;

(l) aligning and bonding the top surface of the silicon wafer with the first surface of the substrate, so that each reservoir recess forms an ink reservoir and each channel recess forms an ink channel and contains a heating element therein, the integral filters preventing entry of contaminating particles into the ink reservoirs which are larger than integral filter openings; and (m) separating the bonded wafer and substrate into a plurality of individual printheads.

5. The method of claim 4, wherein each of the ink channels have a cross-sectional area; and wherein the integral inlet filter has pore sizes smaller than the cross-sectional areas of the ink channels.

* * * * *